(12) United States Patent
Wilson (10) Patent No.: US 9,819,309 B2
(45) Date of Patent: Nov. 14, 2017

(54) OUTPUT STAGE FOR CLASS AB AMPLIFIER

(71) Applicant: SNAPTRACK, INC., San Diego, CA (US)

(72) Inventor: Martin Wilson, Cambridge (GB)

(73) Assignee: SnapTrack, Inc., San Diego, CA (US)

( * ) Notice: Subject to any disclaimer, the term of this patent is extended or adjusted under 35 U.S.C. 154(b) by 0 days.

(21) Appl. No.: 14/775,157

(22) PCT Filed: Apr. 11, 2014

(86) PCT No.: PCT/EP2014/057429
§ 371 (c)(1),
(2) Date: Sep. 11, 2015

(87) PCT Pub. No.: WO2014/167114
PCT Pub. Date: Oct. 16, 2014

(65) Prior Publication Data
US 2016/0036387 A1  Feb. 4, 2016

(30) Foreign Application Priority Data

Apr. 11, 2013 (GB) .................... 1306621.2

(51) Int. Cl.
| H03F 3/18 | (2006.01) |
| H03F 1/02 | (2006.01) |
| H03F 3/30 | (2006.01) |
| H03F 3/21 | (2006.01) |

(52) U.S. Cl.
CPC ......... *H03F 1/0205* (2013.01); *H03F 1/0216* (2013.01); *H03F 3/21* (2013.01); *H03F 3/3022* (2013.01); *H03F 2200/252* (2013.01)

(58) Field of Classification Search
CPC ........................................................ H03F 3/21
USPC ................................................. 330/264, 288
See application file for complete search history.

(56) References Cited

U.S. PATENT DOCUMENTS

| 4,611,180 A | 9/1986 | Stanley |
| 5,140,282 A * | 8/1992 | van Mil ............... H03F 1/0277 |
| | | 330/267 |
| 5,659,266 A | 8/1997 | Shacter et al. |
| 6,433,637 B1 * | 8/2002 | Sauer ..................... H03F 3/303 |
| | | 330/255 |
| 6,466,093 B1 | 10/2002 | Yan |
| 6,501,334 B1 | 12/2002 | Corsi et al. |

(Continued)

FOREIGN PATENT DOCUMENTS

| CN | 1411140 | 4/2003 |
| CN | 1845452 A | 10/2006 |
| CN | 101110575 A | 1/2008 |

(Continued)

*Primary Examiner* — Khanh V Nguyen
*Assistant Examiner* — Khiem Nguyen
(74) *Attorney, Agent, or Firm* — Patterson & Sheridan, L.L.P.

(57) ABSTRACT

The invention relates to a class AB amplifier for receiving an input current and generating an amplified output current and having first and second output transistors connected to provide the output current, wherein if the input current is less than a threshold the first output transistor is enabled and the second output transistor is disabled, and if the input current exceeds a threshold the second output transistor is enabled.

19 Claims, 5 Drawing Sheets

(56) References Cited

U.S. PATENT DOCUMENTS 6,583,669 B1    6/2003    Eschauzier et al.

FOREIGN PATENT DOCUMENTS

| CN | 102624340 A | 8/2012 |
| EP | 3790704 A1 | 8/1997 |

\* cited by examiner

OUTPUT STAGE FOR CLASS AB AMPLIFIER

BACKGROUND TO THE INVENTION

Field of the Invention

The present invention relates to Class AB amplifiers, and particularly but not exclusively to envelope tracking power supplies incorporating Class AB amplifiers.

Description of the Related Art

Envelope tracking applications may require an error amplifier with the ability to output a wide range of output currents at a high frequency. An example implementation of envelope tracking is an envelope tracking power supply with a switched supply to provide most of the wanted signal energy, and an error amplifier to remove unwanted switching artefacts which provides the remainder of the signal energy. Such an amplifier must have high efficiency, be linear, and must be able to handle high bandwidth signals.

Typically the error amplifiers of such implementations are Class AB amplifiers and are required to handle high peak-to-mean current swings. However, if correctly sized to handle large peak-to-mean current swings, a conventional Class AB amplifier typically requires a large quiescent current.

A typical prior art approach for a Class AB error amplifier in an envelope tracking power supply is to provide two transistors that each handle the positive and negative excursions of the waveform respectively. A typical Class AB amplifier has an input stage and an output stage. Typically, the input stage is run in Class A. As such, an existing Class AB arrangement typically consists of an input stage with a single output feeding into an output stage which contains a split at the input. This arrangement accounts for a high standing power dissipation which is typically observed in many high bandwidth amplifiers. The use of current amplification allows the maximum bandwidth to be extracted from the transistors.

Figure 1:
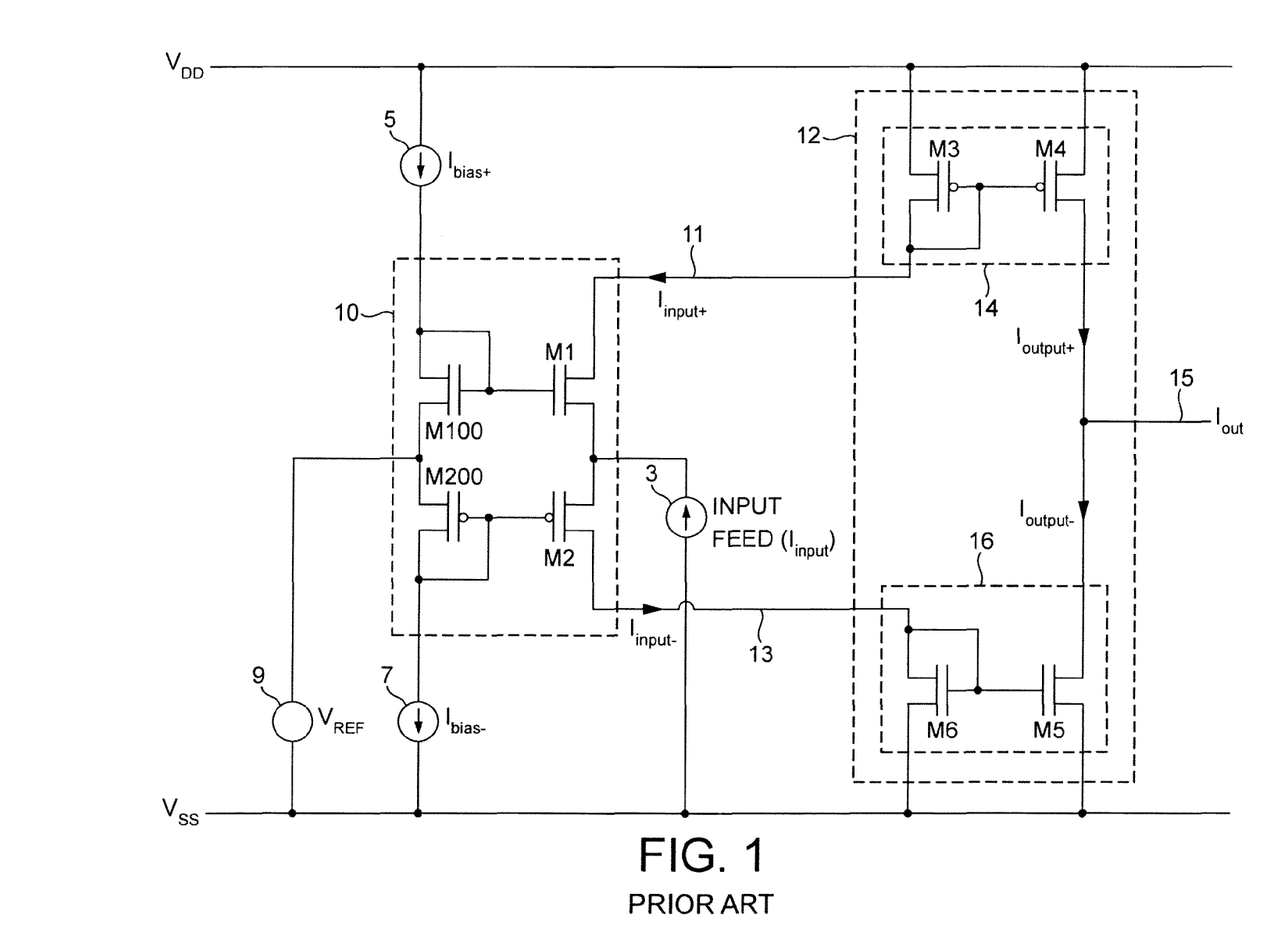
FIG. 1 illustrates a prior art example of a class AB output stage.

An output stage of an exemplary Class AB amplifier of the prior art is illustrated in FIG. 1, and comprises a first stage 10 and a second stage 12. A single line feed to the input stage of the Class AB amplifier is represented by an input feed current source having current $I_{input}$ designated by reference numeral 3.

The first stage 10 has the single input $I_{input}$ and comprises a first pair of transistors M1 and M100 which handle input signals from the single input current $I_{input}$ on the positive excursion. The transistors M100 and M1 are connected in a current mirror arrangement, with the transistor M100 diode connected. A bias current $I_{bias+}$ denoted by reference numeral 5 is provided for the transistor M100 from a positive supply rail $V_{DD}$, to keep the transistors M100 and M1 switched on. The input feed current $I_{input}$ is connected to the transistor M1.

The first stage 10 additionally comprises a second pair of transistors M2 and M200 which handle input signals from the single input current $I_{input}$ on the negative excursion. The transistors M200 and M2 are connected in a current mirror arrangement, with the transistor M200 diode connected. A bias current $I_{bias-}$ denoted by reference numeral 7 is provided for the transistor M200 from a negative supply rail $V_{ss}$, to keep the transistors M200 and M2 switched on. The input feed current $I_{input}$ is connected to the transistor M2.

A DC constant voltage Vref denoted by reference numeral 9 is applied to a common connection of the transistors M100 and M200 of the first stage 10. The DC constant voltage Vref determines the voltage at which the transistors M1 and M2 switch on. The DC constant voltage $V_{ref}$ source is connected between the negative supply rail $V_{ss}$ and the common connection of the transistor M100 and M200.

The transistors M1 and M2 of the first stage 10 split the input signal supplied by the input feed $I_{input}$. The transistor M1 provides a positive part of the input signal $I_{input+}$ on line 11, and the transistor M2 provides a negative part of the input signal $I_{input-}$ on line 13.

The first stage 10 thus has one input $I_{input}$ and two outputs $I_{input+}$ and $I_{input-}$.

The second stage 12 comprises a high-side (or positive) current mirror arrangement 14 provided by transistors M3 and M4. The high-side (or positive) current mirror arrangement 14 receives the positive part of the signal $I_{input+}$. The high-side (or positive) current mirror arrangement 14 provides current from the upper supply $V_{DD}$ to an output current $I_{out}$, denoted as a positive output current $I_{output+}$.

The second stage 12 also comprises a low-side (or negative) current mirror arrangement 16 provided by transistors M5 and M6. The low-side (or negative) current mirror arrangement 16 receives the negative part of the input signal $I_{input-}$. The low-side (or negative) current mirror arrangement 16 returns current to the lower supply $V_{ss}$ from the output current $I_{out}$, denoted as a negative output current $I_{output-}$.

The positive output current $I_{output+}$ and the negative output current $I_{output-}$ are combined to form the output current $I_{out}$ on line 15.

In order to prevent a loss of gain at the crossover point, both transistors M4 and M5 simultaneously conduct in the crossover region. By making both transistors conduct, it is possible to offset the loss in gain of the individual transistors M4 or M5 at low currents.

However, when used as part of the error amplifier in an envelope tracking arrangement (such as an envelope tracking power supply), the second stage 12 must handle a large range of currents, but unfortunately most of the distribution of currents required occurs around the centre of the output waveform exactly where the crossover region is located, and where the currents are relatively small. Thus the arrangement is sized to handle large currents, although most of the time the arrangement handles small currents.

If the transistors are sized correctly to output the maximum current required, in order to satisfy the Class AB criterion of maintaining the gain through the crossover region, a large quiescent bias current is required. The large quiescent bias current typically largely offsets the efficiency gain from using envelope tracking, especially at backed-off output powers. This large quiescent current is required to satisfy operation requirements for large currents, even though most of the operation is for smaller currents in the crossover region.

Another issue that arises relates to the Gm/C factor. The Gm/C factor determines the high frequency response of the output transistors M4 and M5. It is desirable for the Gm/C factor to be high, for improved linearity and low output impedance. However the Gm/C factor varies with current. This variance results in the transistors operating with low Gm/C factor at the points of operation where a high Gm/C factor is most required, i.e. at low currents in the crossover region. At high currents, the gm/C factor is highest, but since this area of operation (outside the crossover region) is accessed infrequently, there is no benefit obtained from the improved linearity and low output impedance at these currents.

The high Gm/C factor for high currents may further potentially give rise to a problem, because the loop gain of the feedback is pushed up bringing a risk of high frequency instability.

Figure 2:
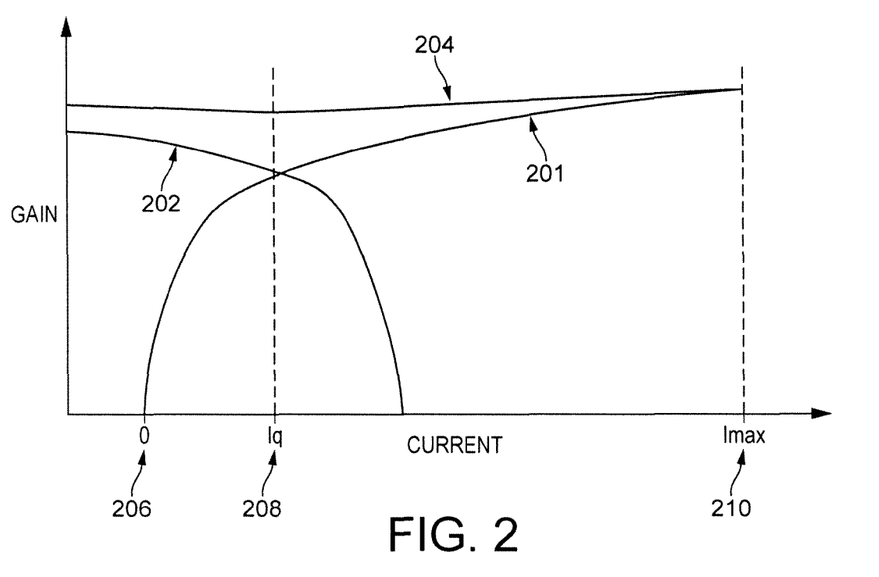
FIG. 2 illustrates a gain plot of the prior art arrangement of FIG. 1.

FIG. 2 shows an exemplary effect of gain on operating this type of Class AB output stage. The aim is to get the roll-off in Gm of the low-side output transistor (M5) to be compensated for by the rise in gain of the high side output transistor (M4). The standing current $I_Q$ is placed at the point where the gains overlap, and therefore each is 6 dB down. With a typical CMOS output stage the $I_Q$ can be as much as 20% of the full output current.

Reference numeral 200 denotes a plot of gain against current for the high-side (positive excursion) wide current range output stage. Reference numeral 202 denotes a plot of gain for the low-side (negative excursion) output stage. Reference numeral 204 denotes a plot of the combined gain. Reference numeral 206 denotes zero current on the x-axis of the plots, reference numeral 208 denotes the quiescent current on the x-axis of the plots, and reference numeral 210 denotes a maximum current on the x-axis of the plots.

SUMMARY OF THE INVENTION

The invention advantageously provides a Class AB amplifier with a wide operating range and minimal crossover distortion with low quiescent current.

In accordance with the invention there is provided a class AB amplifier for receiving an input current and generating an amplified output current and having first and second output transistors connected to provide the output current, wherein if the input current is less than a threshold the first output transistor is enabled and the second output transistor is disabled, and if the input current exceeds a threshold the second output transistor is enabled.

There is preferably provided two output stages driven from a cascade with an offset voltage. A first small output stage operates over a large majority of the output swings. As this stage gain begins to fall at higher currents, a second larger stage begins to take over with this second stage gain rising. Due to the statistics of the error signals the second larger stage will be called upon to deliver current infrequently. This means that any non-linearity introduced by transfer between the two gain paths does not significantly degrade the wanted signal.

For maximum bandwidth and linearity the output stage is preferably current driven. Therefore the output stage is preferably provided with a current mirror at the top and bottom.

This output stage may be fed from other current mirrors earlier in the amplifier chain.

A cascode stage may be placed on the input side of the mirrors. The function of this cascode stage is to receive the current from the previous stage and fix the headroom voltage at the previous stage. If the cascade stage is split into two, and the transistor gates are offset, then at low currents virtually all the current goes through the transistor with the highest gate voltage. However as the output current rises, the transistor with the lower gate voltage begins to conduct. Because this current is now split the gain falls. This offsets the gain at higher currents, and limits the change in gain throughout the operating range of the output stage.

The split of current is used to provide current for the larger higher current output stage that exists in parallel with the lower current output stage.

Preferably the invention also provides a method of controlling a class AB amplifier comprising a class AB amplifier for receiving an input current and generating an amplified output current and having first and second output transistors connected to provide the output current, wherein if the input current is less than a threshold the first output transistor is enabled and the second output transistor is disabled, and if the input current exceeds a threshold the second output transistor is enabled.

BRIEF DESCRIPTION OF THE FIGURES

The invention is now described with reference to the following figures, in which.

DESCRIPTION OF THE PREFERRED EMBODIMENT

In the following description the invention is described with reference to exemplary embodiments and implementations. The invention is not limited to the specific details of any arrangements as set out, which are provided for the purposes of understanding the invention.

In general a class amplifier is provided for receiving an input current and for generating amplified output current. The class amplifier has first and second output transmitters connected to provide the output current. In accordance with a described arrangement, if the input current is less than a threshold then the first output transistor is enabled, and a second output transistor is disabled. If the input current exceeds a threshold then the second output transistor is enabled.

In this way the output current of a class AB amplifier is provided from either physically small or physically large output transistors in accordance with the size of the output current relative to a threshold. The threshold may be implementation-dependent, according to the relative size of the output transistors. The threshold may be compared to the input current signal.

In general, the threshold is set such that the physically smaller output transistors are used when the output signal is smaller, and the physically larger output transistors are used when the output is larger. In practice the threshold may be a range of values, with the larger transistor switching on as the bottom of the range of values is reached.

Figure 3:
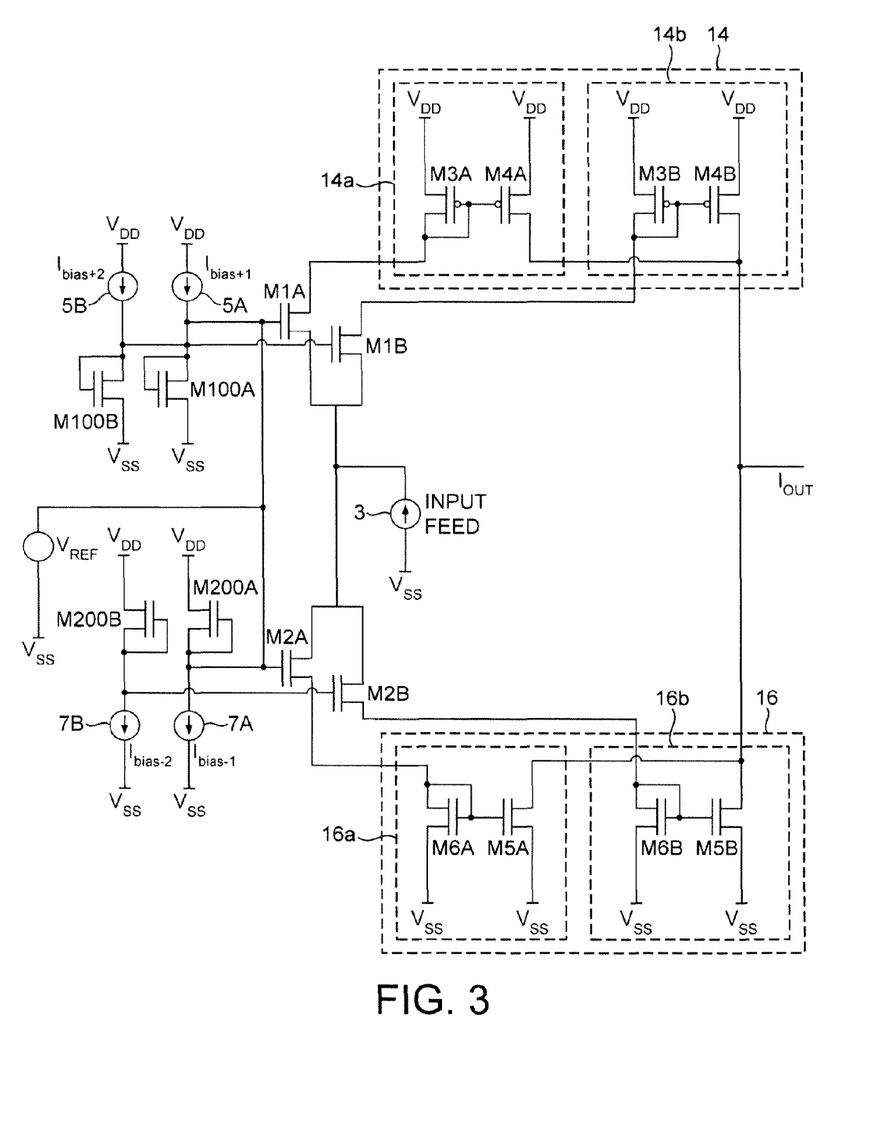
FIG. 3 illustrates an exemplary embodiment of an improvement to a class AB output stage in accordance with the invention.

A modified Class AB amplifier in accordance with an embodiment is shown in FIG. 3.

Comparing FIG. 3 with FIG. 1, high-side (or positive) current mirror arrangement 14 is adapted to comprise of two current mirror arrangements 14a and 14b. Each of the current mirror arrangements 14a and 14b comprises a current mirror arrangement duplicating the current mirror arrangement 14 of FIG. 1. The high-side (or positive) current mirror arrangement 14a comprises transistors M3A and M4A in a current mirror arrangement, and the high-side (or positive) current mirror arrangement 14b comprises transistors M3B and M4B in a current mirror arrangement.

The low-side (or negative) current mirror arrangement 16 is adapted to comprise of two current mirror arrangements 16a and 16b. Each of the current mirror arrangements 16a and 16b comprises a current mirror arrangement duplicating the current mirror arrangement 16 of FIG. 1. The low-side (or negative) current mirror arrangement 16a comprises transistors M5A and M6A in a current mirror arrangement, and the low-side (or negative) current mirror arrangement 16b comprises transistors M5B and M6B in a current mirror arrangement.

The transistor M1 of the FIG. 1 arrangement is split in the FIG. 3 arrangement into two transistors M1A and M1B. The transistor M100 of the FIG. 1 arrangement is split in the FIG. 3 arrangement into two transistors M100A and M100B.

The transistor M2 of the FIG. 1 arrangement is split in the FIG. 3 arrangement into two transistors M2A and M2B. The transistor M200 of the FIG. 1 arrangement is split in the FIG. 3 arrangement into two transistors M200A and M200B.

Each of transistors M100A and M100B is connected to a different bias current, $I_{bias+1}$ and $I_{bias+2}$ respectively denoted by reference numerals 5A and 5B. This results in a different voltage being formed on the drain terminals of each of transistors M100A and M100B, according to their respective bias currents. In turn, this provides a different voltage on the gate terminals of transistors M1A and M1B. The gate of transistor M1A receives a reference voltage Vref, and the voltage on the gate of transistor M1B is the reference voltage Vref plus the voltage difference between the drains of transistors M100A and M100B. In this way the threshold voltage of the transistors M1A and M1B are effectively different, so that they have different responses to the input current.

The transistor M1A controls the current mirror pair M3A and M4A, and the transistor M1B controls the current mirror pair M3B and M4B.

At low input currents M1A, M3A and M4A only are active. M1B does not conduct, and hence the current mirror arrangement formed of M3B and M4B is disabled. This means that M4A can be sized just enough to handle most of the signal dynamics, which take place at low currents in the crossover region.

As the input current signal increases toward its peak, M1B begins to turn on and begins to shunt current around M1A, and this enables M4B to start contributing to the output. At such higher levels of current M4A begins to approach saturation and the gain drops. At this point, the gain is mainly contributed by M4B.

Thus as the input current approaches and exceeds a threshold, the larger output transistor turns on to provide the larger output current.

Figure 4:
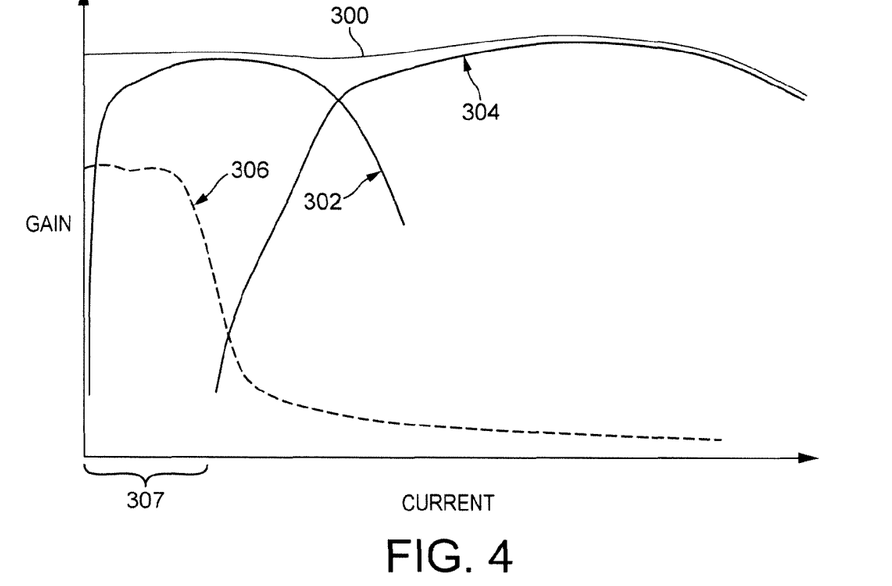
FIG. 4 illustrates a gain plot of an improved class AB output stage in accordance with the invention.

Reference can be made to FIG. 4 which shows the operation of an extended class AB amplifier as described.

Reference numeral 302 of FIG. 4 denotes a plot of the gain of the small output stage of FIG. 3, provided by transistor M4A. Reference numeral 304 denotes a plot of the gain of the large output stage of FIG. 3, provided by transistor M4B.

Also denoted in FIG. 4 by reference numeral 300 is a typical distribution of signals that will be encountered when an exemplary amplifier is used as an error amplifier in a switched envelope tracker. This means that any non-linearity contributed by the changeover to the larger stage is negligible. Because of this much reduced size of the smaller stage, the crossover quiescent current can be made much lower, and can be as low as 2% of the overall maximum output current.

The dashed line denoted by reference numeral 306 denotes the error amplifier signal distribution (on a logarithmic scale). As denoted by reference numeral 301, the majority of activity is on the left hand side of the Figure.

The foregoing description describes the operation of the high-side of the class AB amplifier output. In certain arrangements only a high-side may be provided, but in more practical arrangements both a high-side and a low-side arrangement may be provided.

The first and second output transistors may thus be connected to a first plurality of a supply voltage. A third and fourth output transistor may be provided connected to a second plurality of the supply voltage. If the input current is less than a threshold the first and third output transistors may be enabled, and if the input current exceeds the threshold the second and fourth output transistors may be enabled.

The principle of operation for the high-side described above applies equally for the low-side.

Each of transistors M200A and M200B is connected to a different bias current, $I_{bias-1}$ and $I_{bias-2}$ respectively denoted by reference numerals 7A and 7B. This results in a different voltage being formed on the drain terminals of each of transistors M200A and M200, according to their respective bias currents. In turn, this provides a different voltage on the gate terminals of transistors M2A and M2B. The gate of transistor M2A receives the voltage Vref, and the voltage on the gate of transistor M1B is the reference voltage Vref plus the voltage difference between the drains of transistors M200A and M200B.

The transistor M2A controls the current mirror pair M6A and M5A, and the transistor M2B controls the current mirror pair M6B and M5B.

At low input currents M2A, M6A and M5A only are active. M2B does not conduct, and hence the current mirror arrangement formed of M6B and M5B is disabled. This means that M5A can be sized just enough to handle most of the signal dynamics, which take place at low currents in the crossover region.

As the input current signal decreases toward its negative peak, M2B begins to turn on and begins to shunt current around M2A, and this enables M5B to start contributing to the output. At such higher levels of current M5A begins to approach saturation and the gain drops. At this point, the gain is mainly contributed by M5B.

Thus it can be understood that in the main region of operation—the crossover region—where output currents are relatively low, output transistors M4A and M5A are used to provide the output current which are appropriately sized for small currents. At the regions of operation where higher currents are required, different output transistors M4B and M5B—appropriately sized to handle larger currents—are used.

Some means of providing the correct gate voltage between M1A and M1B (and M2A and M2B) is preferably required, which is preferably arranged to account for changes in process and temperature. This may be achieved by the use of replica transistors for the transistors M1A and M1B, that are reduced size compared to transistor M1 in FIG. 1, but the same geometries as M1 of FIG. 1. The same applies for the transistors M2A and M2B.

The offset voltage necessary to generate the segmentation in current drives is obtained by providing two different bias currents in each side, which in the high side are denoted $I_{bias+1}$ and $I_{bias+2}$. Current $I_{bias+1}$ is preferably proportional to the intended crossover current, whereas $I_{bias+2}$ represents the transition current to the higher current segment.

It can be understood that the segmentation of drive currents may be obtained by some other means, and the embodiment illustrated in FIG. 3 is merely exemplary.

Figure 5:
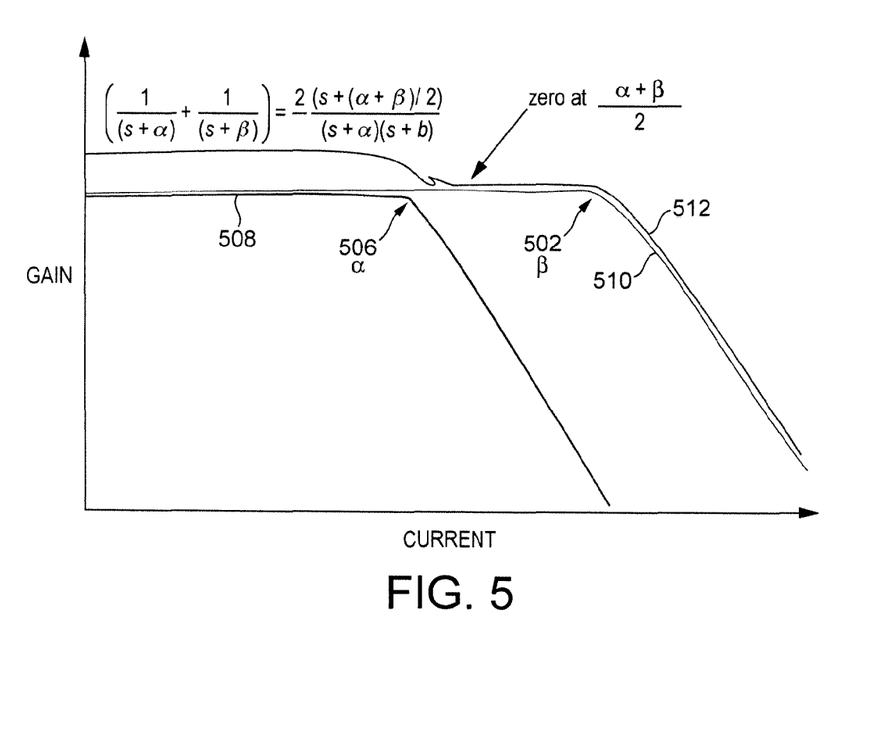
FIG. 5 illustrates a gain plot.

The effect on the bandwidth of the Class AB amplifier of FIG. 3 is illustrated with respect to FIG. 5. The analysis is simplified by assuming that each stage (M3A/M4A and M3B/M4B on the positive side) has identical gain.

The small stage, provided by current mirror arrangements M3A/M4A and M5A/M6A has a gain plot 510 and a pole at β denoted by reference numeral 502. The large stage, provided by current mirror arrangements M3B/M4B and M5B/M6B, has a gain plot 508 and a lower frequency pole α denoted by reference numeral 506, as the larger transistors have a lower current density.

When the sum of the two poles are factored as shown by the gain plot 512 of FIG. 5, the low frequency pole appears at the output, but is cancelled by a zero at (α+β)/2. The high frequency response is therefore dominated by the pole at β, and there is little negative impact on the phase margin of the complete amplifier.

The phase of the prior art and the extended output stage are compared in FIG. 5. At low frequencies the extended stage has extra lag, but at higher frequencies when the amplifier unity gain is to be achieved, there is little difference between the two stages. As the current increases then the pole at α will begin to dominate, but at that point the pole will be at a high enough frequency to avoid comprising the output bandwidth.

Figure 6:
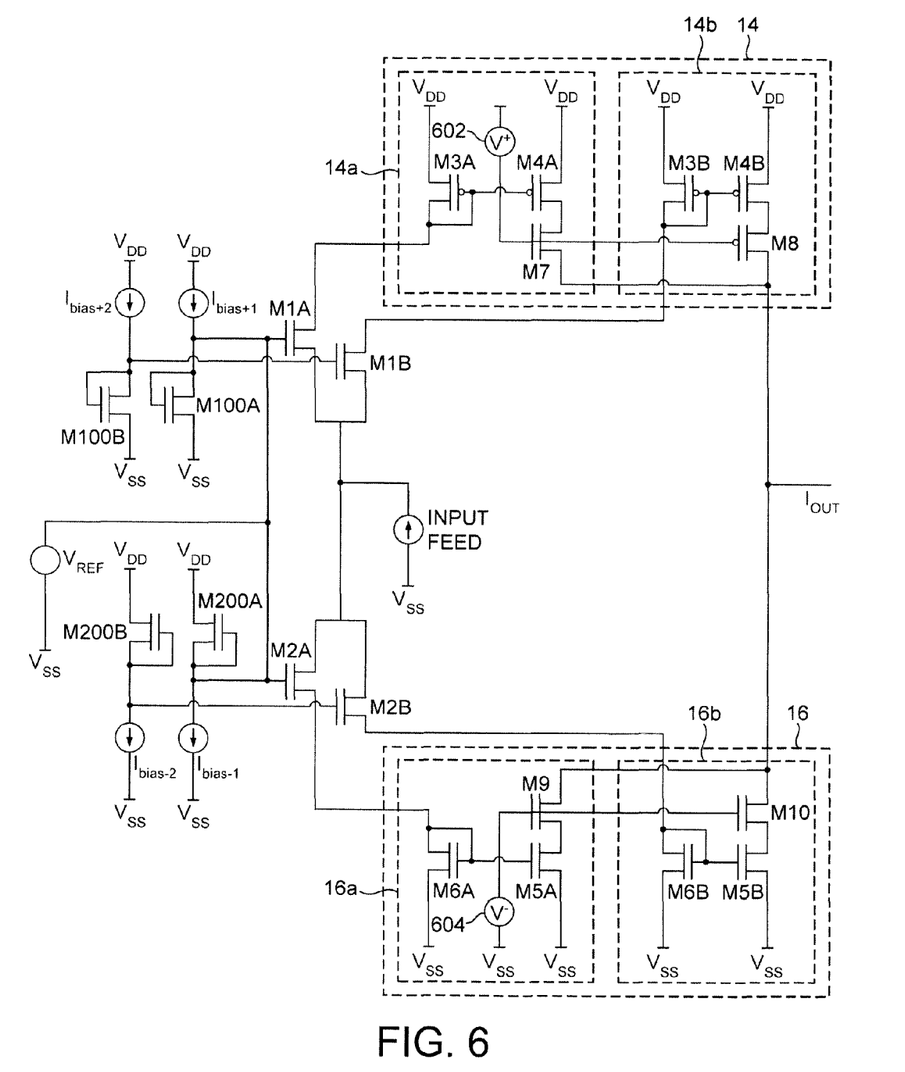
FIG. 6 illustrates an improvement to the arrangement of FIG. 3 in accordance with an exemplary example.

With reference to FIG. 6, a further optional enhancement to the arrangement of FIG. 3 is illustrated.

A cascade transistor M7 is connected between transistor M4A and the current output, cascade transistor M8 is connected between transistor M4B and the current output, a cascade transistor M9 is connected between transistor M5A and the current output, and a cascade transistor M10 is connected between transistor M5B and the current output. The gates of the transistors M7 and M8 receive a voltage from a voltage source V⁺ 602 connected between the gates and $V_{DD}$. The gates of the transistors M9 and M10 receive a voltage from a voltage source V⁻ 604 connected between the gate and $V_{ss}$.

These additional cascade transistors M7, M8, M9, M10 introduce the benefit of separating the poles in each output transistor, thus maintaining bandwidth.

A disadvantage is associated in using such a cascade arrangement, in that the transistors M4A and M5A must be made larger to accommodate the extra transistor in the output path. However in the presence of the parallel paths presented in the described arrangements, this is not a significant issue and the advantages of the cascade stage can be fully realised.

The invention has been described herein by way of example with reference to embodiments. The invention is not limited to the described embodiments, not to specific combination of features in embodiments. Modifications may be made to the embodiments within the scope of the invention. The scope of the invention is defined by the appended claims.

The invention claimed is:

1. A class AB amplifier for receiving an input current and generating an amplified output current and having first, second, third, and fourth output transistors connected to provide the output current, wherein the first and third output transistors are configured to be enabled and the second and fourth output transistors are configured to be disabled when the input current is less than a threshold, and the second and fourth output transistors are configured to be enabled when the input current exceeds the threshold, and wherein the second output transistor is physically larger than the first output transistor.

2. The class AB amplifier of claim 1 wherein the first and second output transistors form part of first and second current mirrors.

3. The class AB amplifier of claim 2 further comprising first and second input transistors for controlling the first and second current mirrors in dependence on the input current.

4. The class AB amplifier of claim 3, wherein threshold voltages of the first and second input transistors are different, such that the first input transistor is responsive to input currents below the threshold and the second input transistor is responsive to input currents above the threshold.

5. The class AB amplifier of claim 3, wherein a voltage at at least one of a control node of the first input transistor or a control node of the second input transistor is fixed.

6. The class AB amplifier of claim 5, wherein the voltage at the at least one of the control node of the first input transistor or the control node of the second input transistor is set by a current source and a diode-connected transistor.

7. The class AB amplifier of claim 1 wherein the first and second output transistors are respectively connected to provide the output current through cascode transistors.

8. The class AB amplifier of claim 1, wherein the first and second output transistors are connected to a first polarity of a supply voltage, and wherein the third and fourth output transistors are connected to a second polarity of the supply voltage.

9. The class AB amplifier of claim 1, wherein the fourth output transistor is physically larger than the third output transistor.

10. The class AB amplifier of claim 1, wherein the third and fourth output transistors form part of third and fourth current mirrors.

11. The class AB amplifier of claim 10 further comprising third and fourth input transistors for controlling the third and fourth current mirrors in dependence on the input current.

12. The class AB amplifier of claim 11, wherein threshold voltages of the third and fourth input transistors are different, such that the third input transistor is responsive to input currents below the threshold and the fourth input transistor is responsive to input currents above the threshold.

13. The class AB amplifier of claim 11, wherein a voltage at at least one of a control node of the third input transistor or a control node of the fourth input transistor is fixed.

14. The class AB amplifier of claim 13, wherein the voltage at the at least one of the control node of the third input transistor or the control node of the fourth input transistor is set by a current source and a diode-connected transistor.

15. The class AB amplifier of claim 10, wherein the third and fourth output transistors are respectively connected to provide the output current through cascode transistors.

16. A method of controlling a class AB amplifier for receiving an input current and generating an amplified output current and having first second, third, and fourth output transistors connected to provide the output current, wherein the second output transistor is physically larger than the first output transistor, comprising:
  enabling the first and third output transistors and disabling the second and fourth output transistors when the input current is less than a threshold; and
  enabling the second and fourth output transistors when the input current exceeds the threshold.

17. The method of claim 16, wherein the first and second output transistors of the class AB amplifier form part of first and second current mirrors, wherein first and second input transistors control the first and second current mirrors in dependence on the input current, and wherein threshold voltages of the first and second input transistors are different, the method further comprising:

enabling the first input transistor responsive to input currents below the threshold; and
  enabling the second input transistor responsive to input currents above the threshold.

18. The method of claim 16, wherein the first and second output transistors are connected to a first polarity of a supply voltage, and wherein the third and fourth output transistors are connected to a second polarity of the supply voltage.

19. A method of controlling a class AB amplifier for receiving an input current and generating an amplified output current and having first and second output transistors connected to provide the output current, wherein the second output transistor is physically larger than the first output transistor, wherein third and fourth output transistors form part of third and fourth current mirrors, wherein third and fourth input transistors control the third and fourth current mirrors in dependence on the input current, and wherein threshold voltages of the third and fourth input transistors are different, the method comprising:

enabling the first output transistors and disabling the second output transistors when the input current is less than a threshold;
  enabling the second output transistors when the input current exceeds the threshold;
  enabling the third input transistor responsive to input currents below the threshold; and
  enabling the fourth input transistor responsive to input currents above the threshold.

* * * * *